US012696814B2

(12) United States Patent　　　(10) Patent No.:　US 12,696,814 B2
Kim et al.　　　　　　　　　　　　(45) Date of Patent:　　　Jul. 28, 2026

(54) SEMICONDUCTOR PACKAGE

(71) Applicant: SAMSUNG ELECTRONICS CO., LTD., Suwon-si (KR)

(72) Inventors: Young-Ja Kim, Suwon-si (KR); Sunwon Kang, Suwon-si (KR); Mi-Na Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 379 days.

(21) Appl. No.: 18/442,252

(22) Filed: Feb. 15, 2024

(65) Prior Publication Data

US 2025/0038156 A1　　　Jan. 30, 2025

(30) Foreign Application Priority Data

Jul. 24, 2023　　(KR) ........................ 10-2023-0096089

(51) Int. Cl.
| | |
|---|---|
| *H01L 25/10* | (2006.01) |
| *H10W 40/22* | (2026.01) |
| *H10W 40/25* | (2026.01) |
| *H10W 70/65* | (2026.01) |
| *H10W 74/10* | (2026.01) |
| *H10W 90/00* | (2026.01) |
| *H10W 72/20* | (2026.01) |
| *H10W 74/00* | (2026.01) |
| *H10W 90/20* | (2026.01) |

(52) U.S. Cl.
CPC ........... *H10W 90/00* (2026.01); *H10W 40/22* (2026.01); *H10W 40/258* (2026.01); *H10W 70/65* (2026.01); *H10W 74/114* (2026.01);

*H10W 90/701* (2026.01); *H10W 72/223* (2026.01); *H10W 72/252* (2026.01); *H10W 72/255* (2026.01); *H10W 74/00* (2026.01); *H10W 90/20* (2026.01); *H10W 90/288* (2026.01); *H10W 90/722* (2026.01); *H10W 90/724* (2026.01)

(58) Field of Classification Search
CPC ... H10W 90/00; H10W 40/22; H10W 40/258; H10W 70/65
See application file for complete search history.

(56) References Cited

U.S. PATENT DOCUMENTS

| | | |
|---|---|---|
| 8,618,652 B2 | 12/2013 | Nalla et al. |
| 9,219,021 B2 | 12/2015 | Seko et al. |
| 9,899,352 B2 | 2/2018 | Kim |
| 10,163,867 B2 | 12/2018 | Kim et al. |
| 10,332,862 B2 | 6/2019 | Chen et al. |
| 10,535,612 B2 | 1/2020 | Chen |

(Continued)

FOREIGN PATENT DOCUMENTS

| | | |
|---|---|---|
| CN | 102834906 A | 12/2012 |
| CN | 108109974 A | 6/2018 |

*Primary Examiner* — Thao P Le
(74) *Attorney, Agent, or Firm* — Morgan, Lewis & Bockius LLP

(57) ABSTRACT

A semiconductor package includes a first substrate. A second substrate is spaced apart from the first substrate. A semiconductor chip is between the first substrate and the second substrate. The semiconductor chip is electrically connected to the second substrate. A molding layer surrounds the semiconductor chip. A plate directly contacts a bottom surface of the semiconductor chip. A heat transfer structure connects the plate and the first substrate to each other.

20 Claims, 9 Drawing Sheets

(56) References Cited

U.S. PATENT DOCUMENTS

| | | | |
|---|---|---|---|
| 11,502,060 B2 | 11/2022 | Bean et al. | |
| 2018/0061807 A1 | 3/2018 | Lee | |
| 2022/0005793 A1* | 1/2022 | Kang | H10W 90/00 |
| 2022/0352110 A1* | 11/2022 | Yim | H10W 90/401 |
| 2022/0384322 A1* | 12/2022 | Kwon | H10W 90/701 |
| 2023/0071812 A1* | 3/2023 | Jang | H10W 72/0198 |
| 2024/0063085 A1* | 2/2024 | Park | H10W 40/251 |
| 2024/0170464 A1* | 5/2024 | Jo | H10W 72/20 |
| 2025/0210481 A1* | 6/2025 | Lee | H10W 42/121 |

* cited by examiner

FIG. 7

SEMICONDUCTOR PACKAGE

CROSS-REFERENCE TO RELATED APPLICATION

This application claims priority under 35 U.S.C § 119 to Korean Patent Application No. 10-2023-0096089, filed on Jul. 24, 2023 in the Korean Intellectual Property Office, the disclosure of which is incorporated by reference in its entirety herein.

1. TECHNICAL FIELD

The present inventive concept relates to a semiconductor package, and more particularly, to a semiconductor package including a plate.

2. DISCUSSION OF RELATED ART

A semiconductor package is provided to implement an integrated circuit chip that may be applied to electronic products. Typically, a semiconductor package is configured such that a semiconductor chip is mounted on a printed circuit board (PCB) and bonding wires or bumps are used to electrically connect the semiconductor chip to the printed circuit board. However, as the electronic industry has advanced, various studies have been conducted to increase the reliability and durability of semiconductor packages.

SUMMARY

Some embodiments of the present inventive concept provide a semiconductor package with increased electrical properties and increased reliability.

According to an embodiment of the present inventive concept, a semiconductor package includes a first substrate. A second substrate is spaced apart from the first substrate. A semiconductor chip is between the first substrate and the second substrate. The semiconductor chip is electrically connected to the second substrate. A molding layer surrounds the semiconductor chip. A plate directly contacts a bottom surface of the semiconductor chip. A heat transfer structure connects the plate and the first substrate to each other.

According to an embodiment of the present inventive concept, a semiconductor package includes a first substrate. A second substrate is spaced apart from the first substrate. A semiconductor chip is between the first substrate and the second substrate. The semiconductor chip is electrically connected to the second substrate. A molding layer surrounds the semiconductor chip. A plate directly contacts a bottom surface of the semiconductor chip. A connection conductive structure is between the first substrate and the second substrate. The connection conductive structure electrically connects the first substrate and the second substrate to each other. A bottom surface of the molding layer includes a first portion directly contacting a top surface of the plate. A second portion is spaced apart from the plate and is exposed by an empty space. The empty space is positioned between the molding layer and the first substrate.

According to an embodiment of the present inventive concept, a semiconductor package includes a first substrate. A second substrate is spaced apart from the first substrate. A first semiconductor chip is between the first substrate and the second substrate. A first molding layer surrounds the first semiconductor chip. A plate directly contacts a bottom surface of the first semiconductor chip and a bottom surface of the first molding layer. A through via penetrates the first molding layer and connects the second substrate to the plate. A connection conductive structure electrically connects the first substrate to the second substrate. A heat transfer structure directly contacts a bottom surface of the plate and a top surface of the first substrate. A second semiconductor chip is electrically connected to the second substrate. A second molding layer surrounds the second semiconductor chip.

BRIEF DESCRIPTION OF DRAWINGS

FIG. 7 illustrates a cross-sectional view showing a semiconductor package according to an embodiment of the present inventive concept.

DETAILED DESCRIPTION OF EMBODIMENTS

The following will describe in detail a semiconductor package and its fabrication method according to some embodiments of the present inventive concept in conjunction with the accompanying drawings.

Figure 1:
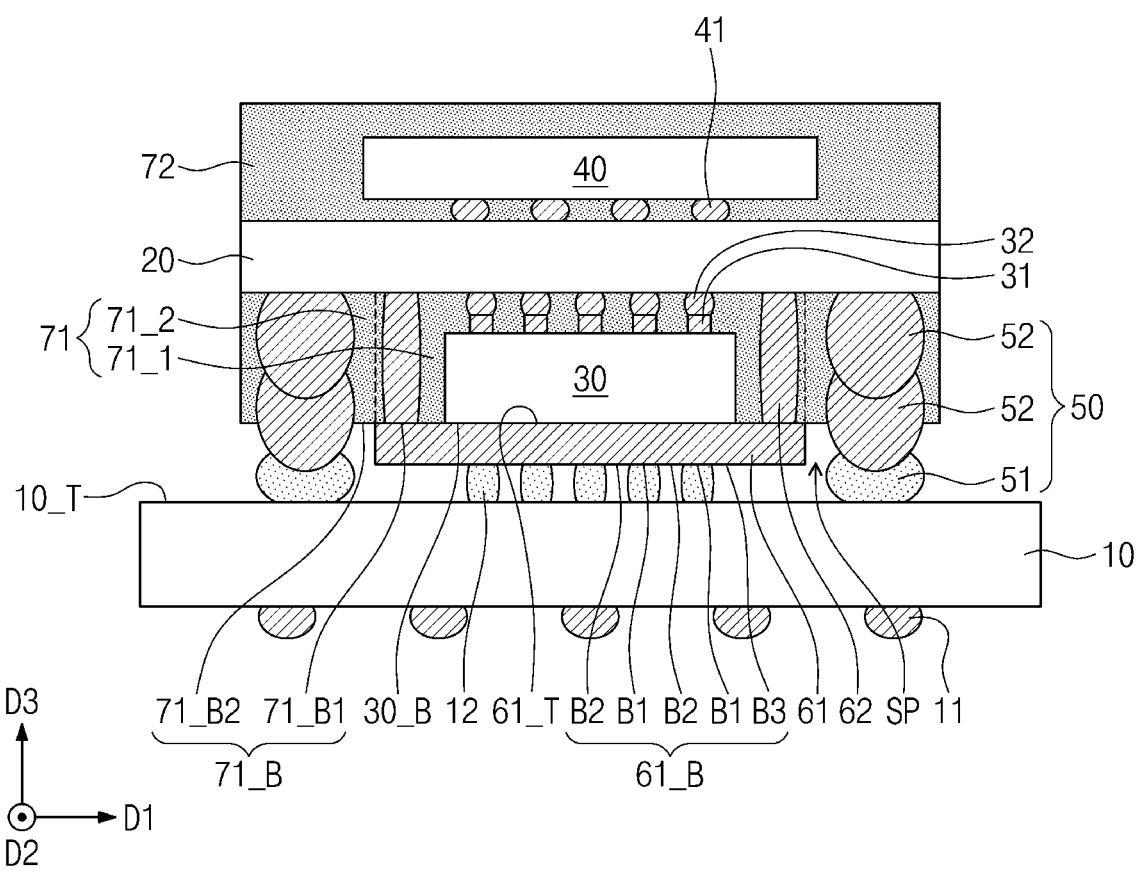
FIG. 1 illustrates a cross-sectional view showing a semiconductor package according to an embodiment of the present inventive concept.

FIG. 1 illustrates a cross-sectional view showing a semiconductor package according to some embodiments.

Referring to FIG. 1, a semiconductor package may include a first substrate 10. In an embodiment, the first substrate 10 may include conductive structures to electrically connect to components mounted on the first substrate 10. For example, in an embodiment the first substrate 10 may include a printed circuit board (PCB), a redistribution substrate, or a semiconductor substrate.

In an embodiment, the first substrate 10 may have a plate shape that expands along a plane defined by a first direction D1 and a second direction D2. The first direction D1 and the second direction D2 may intersect each other. For example, the first direction D1 and the second direction D2 may be horizontal directions that are orthogonal to each other.

However, embodiments of the present inventive concept are not necessarily limited thereto.

Terminals 11 may be disposed on the first substrate 10. The terminals 11 may include a conductive material. The semiconductor package may be electrically connected through the terminals 11 to an external apparatus.

A second substrate 20 may be arranged to be spaced apart in a third direction D3 from the first substrate 10. The third direction D3 may intersect the first direction D1 and the second direction D2. For example, the third direction D3 may be a vertical direction perpendicular to the first direction D1 and the second direction D2. However, embodiments of the present inventive concept are not necessarily limited thereto. The second substrate 20 may include conductive structures to electrically connect to components mounted on the second substrate 20. For example, in an embodiment the second substrate 20 may include a printed circuit board (PCB), a redistribution substrate, or a semiconductor substrate.

A first semiconductor chip 30 may be arranged between the first substrate 10 and the second substrate 20 (e.g., in the third direction D3). The first semiconductor chip 30 may include a semiconductor device. In an embodiment, the semiconductor device may include, for example, at least one selected from a memory device, a logic device, a modem device, and an image sensor device.

Connection conductive structures 50 may be disposed between the first substrate 10 and the second substrate 20 (e.g., in the third direction D3). The connection conductive structure 50 may electrically connect the first substrate 10 and the second substrate 20 to each other. In an embodiment, the connection conductive structure 50 may be in direct contact with a top surface 10_T of the first substrate 10 and a bottom surface of the second substrate 20. The connection conductive structures 50 may be spaced apart from each other. For example, the connection conductive structures 50 may be spaced apart from each other in the first direction D1. The first semiconductor chip 30, a plate 61, through vias 62, chip connection pillars 31, and first chip connection bumps 32 may be disposed between adjacent connection conductive structures 50 (e.g., in the first direction D1).

In an embodiment, the connection conductive structure 50 may include a connection conductive member 51 and at least one connection bump 52 disposed on (e.g., disposed directly thereon) the connection conductive member 51. The connection conductive member 51 and the connection bumps 52 may be stacked in the third direction D3. When viewed in cross-section as shown in FIG. 1, the connection conductive member 51 and the connection bumps 52 may each have a curved sidewall. The connection conductive member 51 and the connection bumps 52 may each have a width in the first direction D1 that changes (e.g., varies) in accordance with a vertical level. For example, in an embodiment, a width in the first direction D1 at an intermediate portion (e.g., in the vertical direction, such as the third direction D3) of the connection conductive member 51 may be greater than widths in the first direction D1 at uppermost and lowermost portions (e.g., in the vertical direction, such as the third direction D3) of the connection conductive member 51. A width in the first direction D1 at an intermediate portion (e.g., in the vertical direction, such as the third direction D3) of the connection bump 52 may be greater than widths in the first direction D1 at uppermost and lowermost portions (e.g., in the vertical direction, such as the third direction D3) of the connection bump 52.

The connection conductive member 51 and the connection bump 52 may include a conductive material. For example, in an embodiment the connection conductive member 51 and the connection bump 52 may include at least one compound selected from Sn, Cu, Au, and Ag. In some embodiments, the connection conductive member 51 and the connection bump 52 may include the same material as each other. In some embodiments, the connection conductive member 51 and the connection bump 52 may include different materials from each other.

In some embodiments, the connection conductive structure 50 may include the connection bumps 52 without the connection conductive member 51, and the first substrate 10 and the second substrate 20 may be electrically connected to each other through the connection bumps 52. While an embodiment of FIG. 1 shows two connection bumps 52 between the first and second substrates 10, 20, embodiments of the present inventive concept are not necessarily limited thereto and the number of the connection bumps 52 may vary.

The chip connection pillars 31 and the first chip connection bumps 32 may be disposed between the first semiconductor chip 30 and the second substrate 20 (e.g., in the third direction D3). The first semiconductor chip 30 may be electrically connected to the second substrate 20 through the chip connection pillar 31 and the first chip connection bump 32. The first semiconductor chip 30 may include a pad connected to the chip connection pillar 31.

The first chip connection bump 32 may be disposed on (e.g., disposed directly thereon in the third direction D3) the chip connection pillar 31. The first chip connection bumps 32 may be connected to (e.g., directly connected thereto) the second substrate 20. When viewed in cross-section as shown in FIG. 1, the chip connection pillar 31 may have a flat sidewall. The chip connection pillar 31 may have a cylindrical shape. In an embodiment, the chip connection pillar 31 may have a constant width (e.g., a uniform width) in the first direction D1. When viewed in cross-section as shown in FIG. 1, the first chip connection bump 32 may have a curved sidewall. A width in the first direction D1 of the first chip connection bump 32 may be changed in accordance with level. For example, in an embodiment a width in the first direction D1 at an intermediate portion (e.g., in the vertical direction, such as the third direction D3) of the first chip connection bump 32 may be greater than widths in the first direction D1 at uppermost and lowermost portions (e.g., in the vertical direction, such as the third direction D3) of the first chip connection bump 32. The chip connection pillar 31 and the first chip connection bump 32 may include a conductive material. For example, in an embodiment the chip connection pillar 31 may include Cu, and the first chip connection bump 32 may include at least one compound selected from Sn, Cu, Au, and Ag.

In some embodiments, the first semiconductor chip 30 may be connected to the second substrate 20 through the first chip connection bump 32 without the chip connection pillar 31. In some embodiments, the first semiconductor chip 30 may be hybrid-bonded to the second substrate 20 without the chip connection pillar 31 or the first chip connection bump 32.

The through vias 62 may be disposed between the first substrate 10 and the second substrate 20 (e.g., in the third direction D3). The through via 62 may be disposed between the first semiconductor chip 30 and the connection conductive structure 50 (e.g., in the first direction D1). The through vias 62 may be spaced apart from each other. For example, the through vias 62 may be spaced apart from each other in the first direction D1. The first semiconductor chip 30 may be disposed between the adjacent through vias 62 (e.g., in the first direction D1). The through via 62 may be connected to (e.g., directly connected thereto) the second substrate 20. When viewed in cross-section as shown in FIG. 1, the through via 62 may have a curved sidewall. A width in the first direction D1 of the through via 62 may be changed in accordance with a vertical level. For example, in an embodiment a width in the first direction D1 at an intermediate portion (e.g., in the vertical direction, such as the third direction D3) of the through via 62 may be greater than widths in the first direction D1 at uppermost and lowermost portions (e.g., in the vertical direction, such as the third direction D3) of the through via 62. The through via 62 may include a conductive material. For example, in an embodiment the through via 62 may include at least one compound selected from Sn, Cu, Au, and Ag.

A first molding layer 71 may be arranged to surround the first semiconductor chip 30, the through vias 62, the chip connection pillars 31, the first chip connection bumps 32, and the connection conductive structures 50. In an embodiment, the first molding layer 71 may be in direct contact with the bottom surface of the second substrate 20. The first molding layer 71 may be spaced apart in the third direction D3 from the first substrate 10. An empty space SP may be positioned between the first molding layer 71 and the first substrate 10. The first molding layer 71 may include a dielectric material. For example, in an embodiment the first molding layer 71 may include an epoxy resin.

The plate 61 may be disposed between the first semiconductor chip 30 and the first substrate 10 (e.g., in the third direction D3). A top surface 61_T of the plate 61 may be in direct contact with a bottom surface 30_B of the first semiconductor chip 30. A bottom surface 71_B of the first molding layer 71 may include a first portion 71_B1 in direct contact with the top surface 61_T of the plate 61 and a second portion 71_B2 that is not in direct contact with (e.g., spaced apart from in the first direction D1 from) the top surface 61_T of the plate 61. The second portion 71_B2 of the bottom surface 71_B of the first molding layer 71 may be exposed through the empty space SP between the first molding layer 71 and the first substrate 10. The top surface 61_T of the plate 61 may be in direct contact with a bottom surface of the through via 62. In an embodiment, a thickness in the third direction D3 of the plate 61 may range, for example, from about 1 μm to about 1,000 μm. The plate 61 may include a conductive material. For example, in an embodiment the plate 61 may include one or both of Ni and Cu. However, embodiments of the present inventive concept are not necessarily limited thereto.

In some embodiments, the plate 61 may include a first layer, a second layer, and a third layer that are sequentially stacked along the third direction D3. In an embodiment, the first and third layers may include Ni, and the second layer may include Cu. As the first and third layers include Ni, the plate 61 may be prevented or restricted from oxidation.

Heat transfer structures 12 may be disposed between the plate 61 and the first substrate 10 (e.g., in the third direction D3). The heat transfer structures 12 may be spaced apart from each other. For example, in an embodiment the heat transfer structures 12 may be spaced apart from each other in the first direction D1. The heat transfer structure 12 may connect the plate 61 and the first substrate 10 to each other. For example, in an embodiment the heat transfer structure 12 may be in direct contact with a bottom surface 61_B of the plate 61 and the top surface 10_T of the first substrate 10. The heat transfer structures 12 may overlap in the third direction D3 with the first semiconductor chip 30. The heat transfer structure 12 may include a conductive material. For example, in an embodiment the heat transfer structure 12 may include at least one compound selected from Sn, Cu, Au, and Ag.

The bottom surface 61_B of the plate 61 may include first portions B1, second portions B2, and third portions B3. The first portion B1 of the bottom surface 61_B of the plate 61 may be in direct contact with the heat transfer structure 12. The second and third portions B2 and B3 of the bottom surface 61_B of the plate 61 may not be in direct contact (e.g., may be spaced apart from in the first direction D1) the heat transfer structure 12. The third portion B3 of the bottom surface 61_B of the plate 61 may be an outer portion of the bottom surface 61_B of the plate 61.

The third portions B3 of the bottom surface 61_B of the plate 61 may be spaced apart from each other in the first direction D1. The first and second portions B1 and B2 of the bottom surface 61_B of the plate 61 may be disposed between the third portions B3 of the bottom surface 61_B of the plate 61. In some embodiments, when viewed in plan, the third portions B3 of the bottom surface 61_B of the plate 61 may surround the first and second portions B1 and B2 of the bottom surface 61_B of the plate 61 (e.g., in the first and/or second directions D1, D2).

The first and second portions B1 and B2 of the bottom surface 61_B of the plate 61 may be alternately arranged along the first direction D1. The second portion B2 of the bottom surface 61_B of the plate 61 may be disposed between adjacent first portions B1 of the bottom surface 61_B of the plate 61. The first portion B1 of the bottom surface 61_B of the plate 61 may be disposed between adjacent second portions B2 of the bottom surface 61_B of the plate 61. In an embodiment, a length in the first direction D1 of the third portion B3 of the bottom surface 61_B of the plate 61 may be greater than a length in the first direction D1 of the first portion B1 of the bottom surface 61_B of the plate 61. The length in the first direction D1 of the third portion B3 of the bottom surface 61_B of the plate 61 may be greater than a length in the first direction D1 of the second portion B2 of the bottom surface 61_B of the plate 61.

In an embodiment, the heat transfer structure 12 may have a width (e.g., in the first direction D1) that is less than that of the first semiconductor chip 30 and that of the plate 61. For example, a width in the first direction D1 of the heat transfer structure 12 may be less than a width in the first direction D1 of the first semiconductor chip 30 and a width in the first direction D1 of the plate 61. When viewed in cross-section as shown in FIG. 1, the heat transfer structure 12 may have a curved sidewall. In an embodiment, the width in the first direction D1 of the heat transfer structure 12 may be changed in accordance with a vertical level. For example, in an embodiment the width in the first direction D1 at an intermediate portion (e.g., in the vertical direction, such as the third direction D3) of the heat transfer structure 12 may be greater than widths in the first direction D1 at uppermost and lowermost portions (e.g., in the vertical direction, such as the third direction D3) of the heat transfer structure 12.

In some embodiments, the plate 61 may be electrically connected to a ground voltage through the heat transfer structure 12, the conductive structure of the first substrate 10, and the terminal 11. As the plate 61 is connected to a ground voltage, the plate 61 may increase in electromagnetic wave shielding performance.

In an embodiment, the first molding layer 71 may have a width greater than that of the plate 61. For example, a width in the first direction D1 of the first molding layer 71 may be greater than a width in the first direction D1 of the plate 61. The width of the plate 61 may be greater than that of the first semiconductor chip 30. For example, the width in the first direction D1 of the plate 61 may be greater than a width in the first direction D1 of the first semiconductor chip 30. The first molding layer 71 may cover a top surface and a sidewall of the first semiconductor chip 30. The bottom surface 71_B of the first molding layer 71 may be coplanar (e.g., in the third direction D3) with the bottom surface 30_B of the first semiconductor chip 30.

The first molding layer 71 may include a first portion 71_1 that overlaps in the third direction D3 with the plate 61 and a second portion 71_2 that does not overlap in the third direction D3 with the plate 61. The first portion 71_B1 of the bottom surface 71_B of the first molding layer 71 may be a bottom surface of the first portion 71_1 of the first molding layer 71. The second portion 71_B2 of the bottom surface 71_B of the first molding layer 71 may be a bottom surface of the second portion 71_2 of the first molding layer 71. The connection conductive structure 50 may penetrate the second portion 71_2 of the first molding layer 71 (e.g., in the third direction D3). The first semiconductor chip 30, the through vias 62, the chip connection pillars 31, and the first chip connection bumps 32 may be disposed within the first portion 71_1 of the first molding layer 71. The through vias 62 may penetrate the first portion 71_1 of the first molding layer 71 (e.g., in the third direction D3). In some embodiments, when viewed in plan, the first portion 71_1 of the first molding layer 71 may be surrounded by the second portion 71_2 of the first molding layer 71 (e.g., in the first and/or second directions D1, D2).

A second semiconductor chip 40 may be mounted on the second substrate 20. The second semiconductor chip 40 may include a semiconductor device. In an embodiment, the semiconductor device may include, for example, at least one selected from a memory device, a logic device, a modem device, and an image sensor device.

In an embodiment, second chip connection bumps 41 may be arranged to electrically connect the second semiconductor chip 40 to the second substrate 20. The second chip connection bumps 41 may be disposed between the second semiconductor chip 40 and the second substrate 20 (e.g., in the third direction D3). When viewed in cross-section as shown in FIG. 1, the second chip connection bump 41 may have a curved sidewall. For example, a width in the first direction D1 of the second chip connection bump 41 may be changed in accordance with the vertical level. In an embodiment, a width in the first direction D1 at an intermediate portion (e.g., in the vertical direction, such as the third direction D3) of the second chip connection bump 41 may be greater than widths in the first direction D1 at uppermost and lowermost portions (e.g., in the vertical direction, such as the third direction D3) of the second chip connection bump 41. The second chip connection bump 41 may include a conductive material. For example, in an embodiment the second chip connection bump 41 may include at least one compound selected from Sn, Cu, Au, and Ag.

In some embodiments, the second semiconductor chip 40 may be hybrid-bonded to the second substrate 20 without the second chip connection bump 41.

A second molding layer 72 may be arranged to surround the second semiconductor chip 40 and the second chip connection bumps 41. In an embodiment, the second molding layer 72 may be in direct contact with a top surface of the second substrate 20. The second molding layer 72 may include a dielectric material. For example, in an embodiment the second molding layer 72 may include an epoxy resin.

In the semiconductor package according to some embodiments, the bottom surface 30_B of the first semiconductor chip 30 may be in direct contact with the plate 61 without being covered with the first molding layer 71. Therefore, heat generated from the first semiconductor chip 30 may be discharged through the plate 61, the through vias 62, and the heat transfer structures 12, and the semiconductor package may have increased heat dissipation properties. In addition, the plate 61 may shield electromagnetic waves.

Figure 2A:
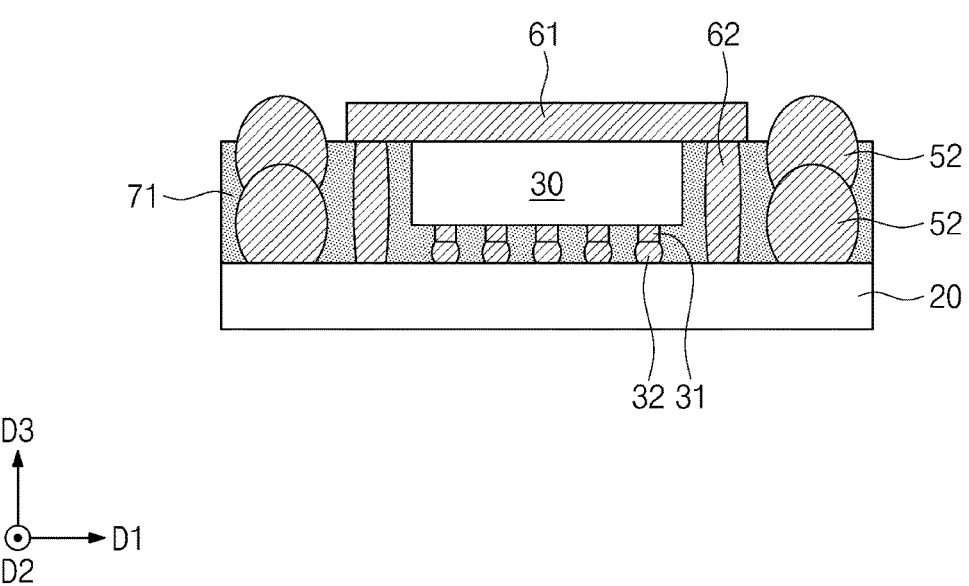
FIGS. 2A and 2B illustrate cross-sectional views showing a method of fabricating a semiconductor package according to some embodiments of the present inventive concept.
Figure 2B:
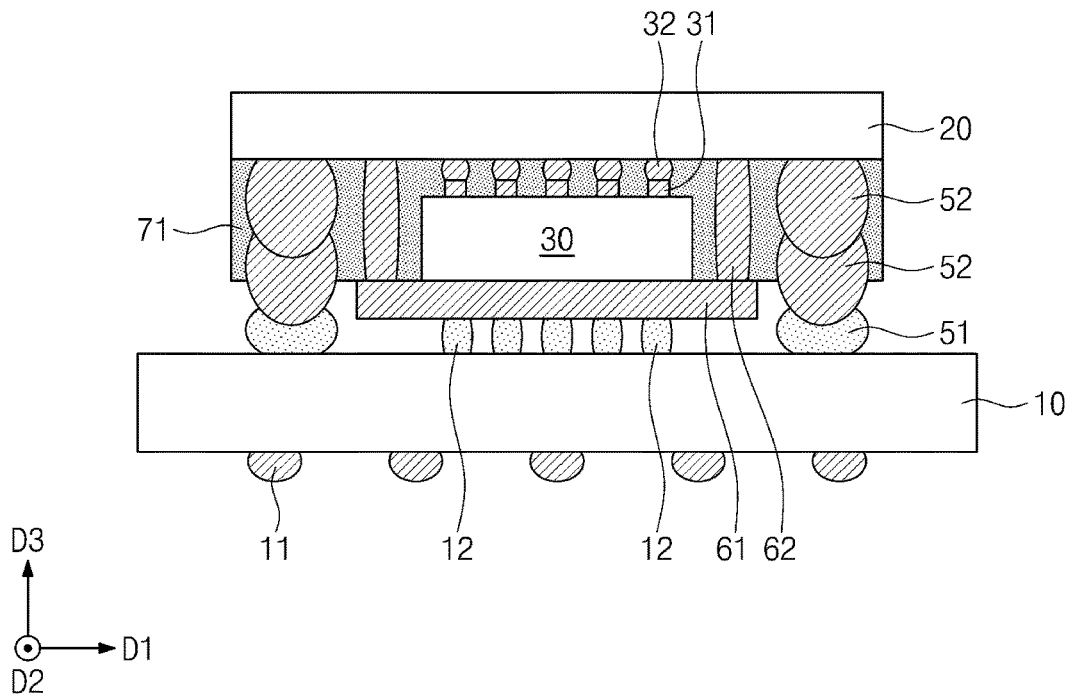

FIGS. 2A and 2B illustrate cross-sectional views showing a method of fabricating a semiconductor package according to some embodiments of the present inventive concept.

Referring to FIG. 2A, first chip connection bumps 32, chip connection pillars 31, and a first semiconductor chip 30 may be formed on a second substrate 20. The second substrate 20 may also include connection bumps 52, through vias 62, and a first molding layer 71 formed thereon.

A plate 61 may be formed on (e.g., formed directly thereon in the third direction D3) the first molding layer 71 and the first semiconductor chip 30.

Referring to FIG. 2B, heat transfer structures 12 and connection conductive members 51 may be formed on (e.g., formed directly thereon in the third direction D3) a first substrate 10. The second substrate 20 may be turned upside down (e.g., inverted). The connection bump 52 and the connection conductive member 51 may be combined with each other, and the plate 61 and the heat transfer structure 12 may be combined with each other.

In some embodiments, the heat transfer structure 12 may be formed on the plate 61, the connection conductive member 51 may be formed on the connection bump 52, and the heat transfer structure 12 and the connection conductive member 51 may be combined with the first substrate 10.

Terminals 11 may be formed which are connected to the first substrate 10.

Referring to FIG. 1, second chip connection bumps 41 and a second semiconductor chip 40 may be formed on the second substrate 20. A second molding layer 72 may be formed on (e.g., formed directly thereon) the second substrate 20.

Figure 3:
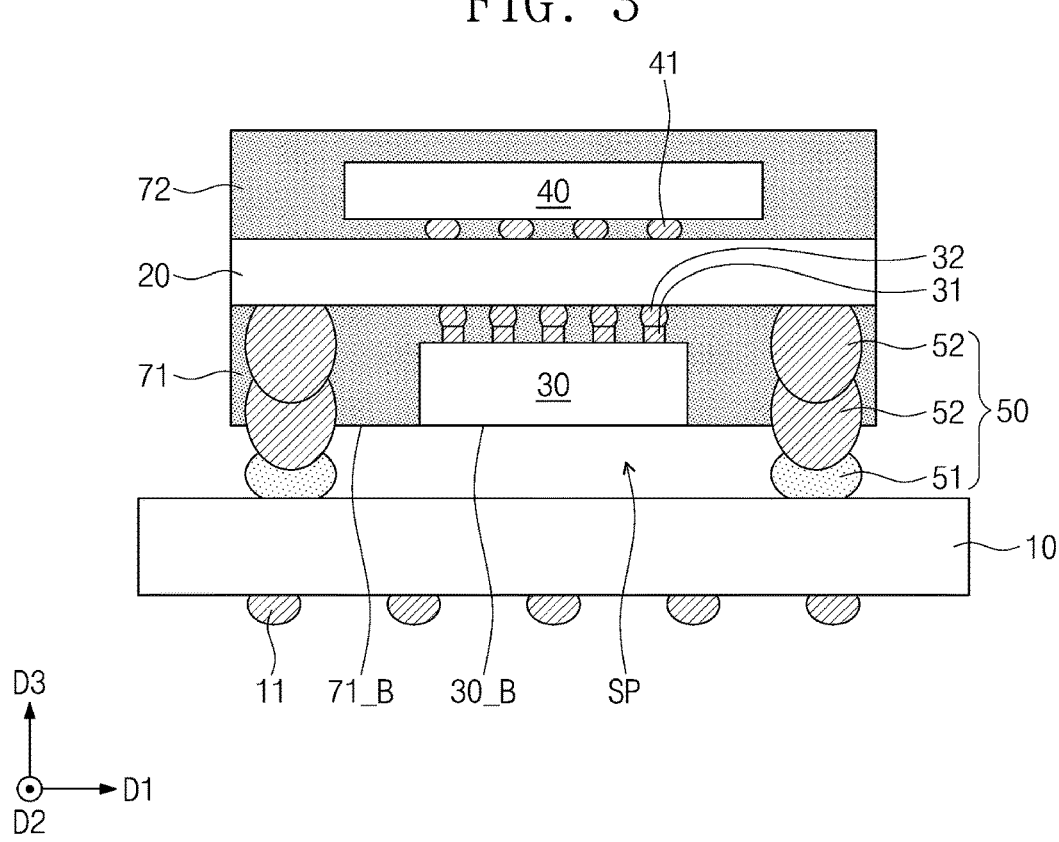
FIG. 3 illustrates a cross-sectional view showing a semiconductor package according to an embodiment of the present inventive concept.

FIG. 3 illustrates a cross-sectional view showing a semiconductor package according to some embodiments. Except that discussed below, a semiconductor package of FIG. 3 may be similar to the semiconductor package of FIG. 1 and a repeated description of similar or identical elements may be omitted for economy of description.

Referring to FIG. 3, a semiconductor package may not include a plate (e.g., plate 61 in FIG. 1) connected to the first semiconductor chip 30 nor a through via (e.g., through vias 62 in FIG. 1) connected to the plate.

An entirety of the bottom surface 30_B of the first semiconductor chip 30 may be exposed through the empty space SP between the first molding layer 71 and the first substrate 10 (e.g., in the third direction D3). An entirety of the bottom surface 71_B of the first molding layer 71 including the first portion 71_B1 and the second portion 71_B2 may be exposed through the empty space SP between the first molding layer 71 and the first substrate 10.

As the bottom surface 30_B of the first semiconductor chip 30 is exposed through the empty space SP, the semiconductor package may have increased heat dissipation properties.

Figure 4:
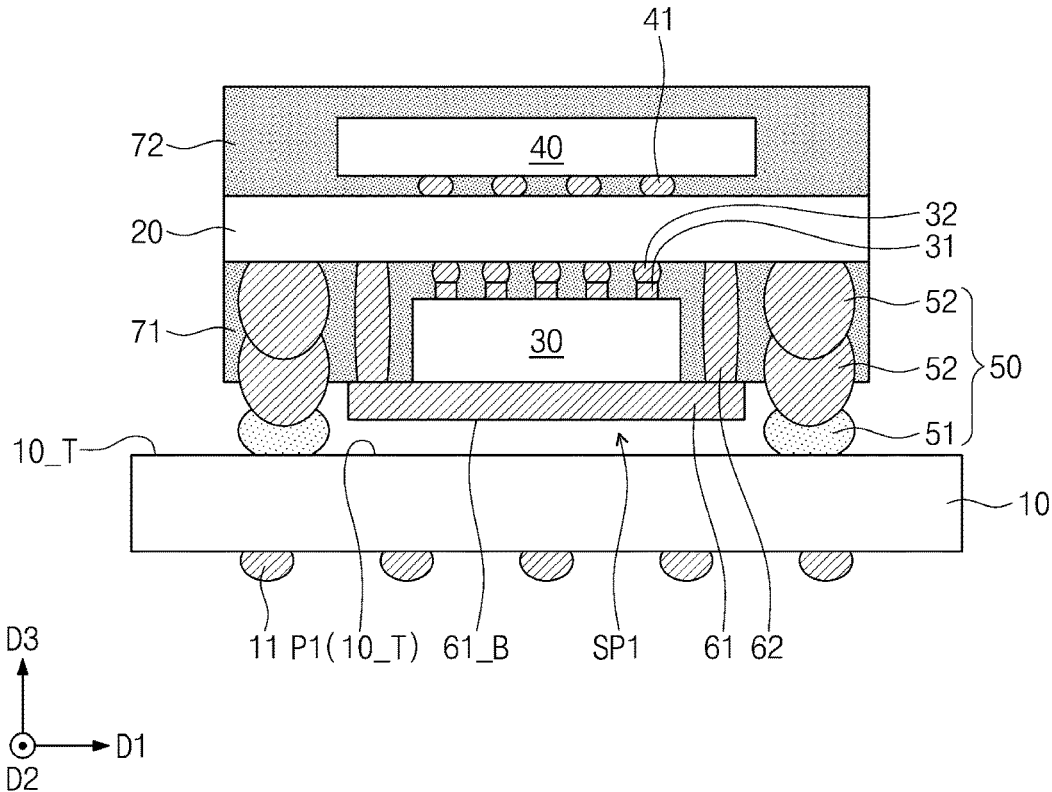
FIG. 4 illustrates a cross-sectional view showing a semiconductor package according to an embodiment of the present inventive concept.

FIG. 4 illustrates a cross-sectional view showing a semiconductor package according to some embodiments. Except that discussed below, a semiconductor package of FIG. 4 may be similar to the semiconductor package of FIG. 1 and a repeated description of similar or identical elements may be omitted for economy of description.

Referring to FIG. 4, a semiconductor package may not include heat transfer structures (e.g., heat transfer structures 12 in FIG. 1) connected to the plate 61.

An entirety of the bottom surface 61_B of the plate 61 may be exposed through an empty space SP1 between the plate 61 and the first substrate 10 (e.g., in the third direction D3). The top surface 10_T of the first substrate 10 may include an overlapping portion P1 that overlaps in the third direction D3 with the plate 61. An entirety of the overlapping portion P1 included in the top surface 10_T of the first substrate 10 may be exposed through the empty space SP1 between the plate 61 and the first substrate 10.

Figures 5, 6:
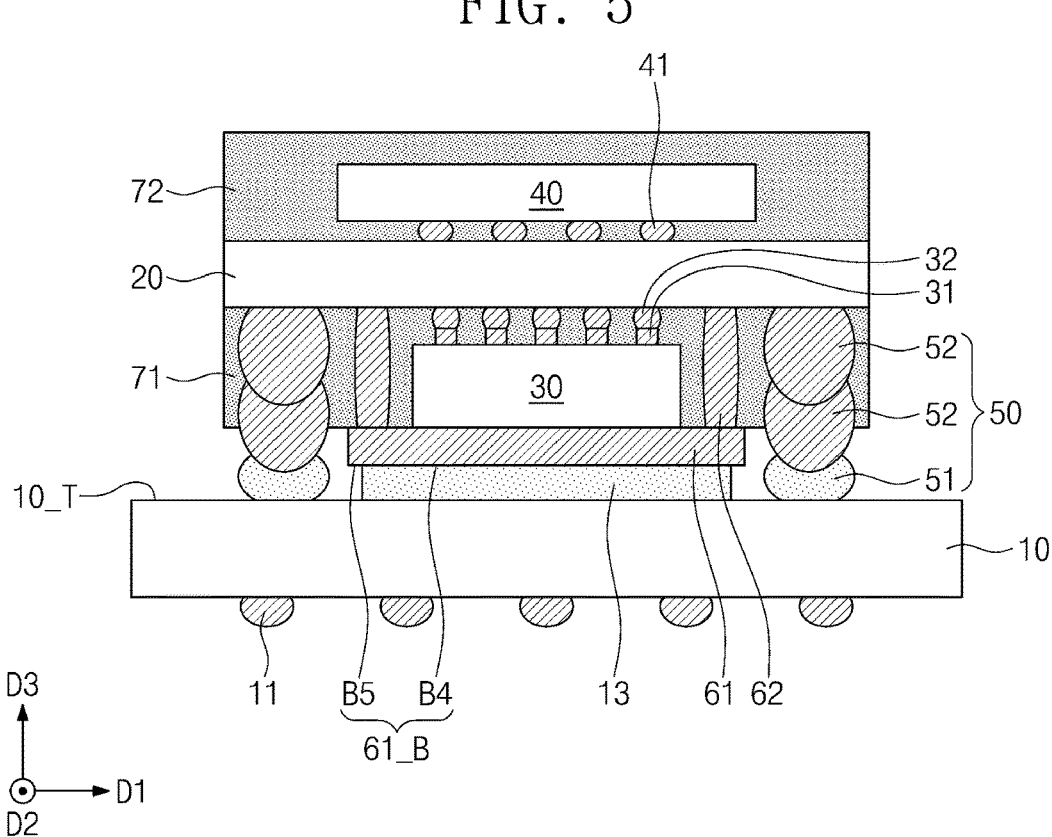
FIG. 5 illustrates a cross-sectional view showing a semiconductor package according to an embodiment of the present inventive concept.
FIG. 6 illustrates a cross-sectional view showing a semiconductor package according to an embodiment of the present inventive concept.

FIG. 5 illustrates a cross-sectional view showing a semiconductor package according to some embodiments. Except that discussed below, a semiconductor package of FIG. 5 may be similar to the semiconductor package of FIG. 1 and a repeated description of similar or identical elements may be omitted for economy of description.

Referring to FIG. 5, a heat transfer structure 13 may be disposed between the plate 61 and the first substrate 10 (e.g., in the first direction D1). In an embodiment, the heat transfer structure 13 may have a width greater than that of the first semiconductor chip 30. For example, a width in the first direction D1 of the heat transfer structure 13 may be greater than a width in the first direction D1 of the first semiconductor chip 30. The width of the heat transfer structure 13 may be less than that of the plate 61. For example, the width in the first direction D1 of the heat transfer structure 13 may be less than a width in the first direction D1 of the plate 61. The heat transfer structure 13 may overlap in the third direction D3 with the through vias 62.

The bottom surface 61_B of the plate 61 may include a first portion B4 in direct contact with the heat transfer structure 12 and second portions B5 that do not directly contact with (e.g., are spaced apart from in the first direction D1) the heat transfer structure 12. The second portions B5 of the bottom surface 61_B of the plate 61 may be outer portions that are spaced apart from each other in the first direction D1. The first portion B4 of the bottom surface 61_B of the plate 61 may be disposed between the second portions B5 of the bottom surface 61_B of the plate 61 (e.g., in the first direction D1). In some embodiments, when viewed in plan, the second portions B5 of the bottom surface 61_B of the plate 61 may surround the first portion B4 of the bottom surface 61_B of the plate 61 (e.g., in the first and/or second directions D1, D2).

In an embodiment, the first portion B4 of the bottom surface 61_B included in the plate 61 may have an area greater than that of the second portion B5 of the bottom surface B5 included in the plate 61. A length in the first direction D1 of the first portion B4 included in the bottom surface 61_B of the plate 61 may be greater than a length in the first direction D1 of the second portion B5 included in the bottom surface 61_B of the plate 61.

FIG. 6 illustrates a cross-sectional view showing a semiconductor package according to some embodiments. Except that discussed below, a semiconductor package of FIG. 6 may be similar to the semiconductor package of FIG. 1 and a repeated description of similar or identical elements may be omitted for economy of description.

Referring to FIG. 6, the semiconductor package may include heat transfer pads 63 which are in direct contact with the bottom surface 61_B of the plate 61. The heat transfer pads 63 may be disposed between the plate 61 and the first substrate 10 (e.g., in the third direction D3). The heat transfer pads 63 may be spaced apart from each other. For example, in an embodiment the heat transfer pads 63 may be spaced apart from each other in the first direction D1. The heat transfer pads 63 may overlap in the third direction D3 with the first semiconductor chip 30.

The heat transfer pad 63 may connect the plate 61 to the heat transfer structure 12. For example, in an embodiment a bottom surface of the heat transfer pad 63 may be in direct contact with a top surface of the heat transfer structure 12 and a top surface of the heat transfer pad 63 may be in direct contact with the plate 61. In an embodiment, a thickness in the third direction D3 of the heat transfer pad 63 may be less than a thickness in the third direction D3 of the plate 61. The thickness in the third direction D3 of the heat transfer pad 63 may be less than a thickness in the third direction D3 of the heat transfer structure 12.

Heat generated from the first semiconductor chip 30 may be discharged through the plate 61, the heat transfer pads 63, the through vias 62, and the heat transfer structures 12. In some embodiments, the plate 61 may be electrically connected to a ground voltage through the heat transfer pad 63, the heat transfer structure 12, the conductive structure of the first substrate 10, and the terminal 11.

In some embodiments, the heat transfer pad 63 may include the same conductive material as that of the plate 61. For example, in an embodiment the heat transfer pad 63 and the plate 61 may include one or both of Ni and Cu. In some embodiments, the heat transfer pad 63 and the plate 61 may be connected to have a single unitary structure with no boundary. In some embodiments, the heat transfer pad 63 may include a different conductive material from that of the plate 61.

Figure 7:
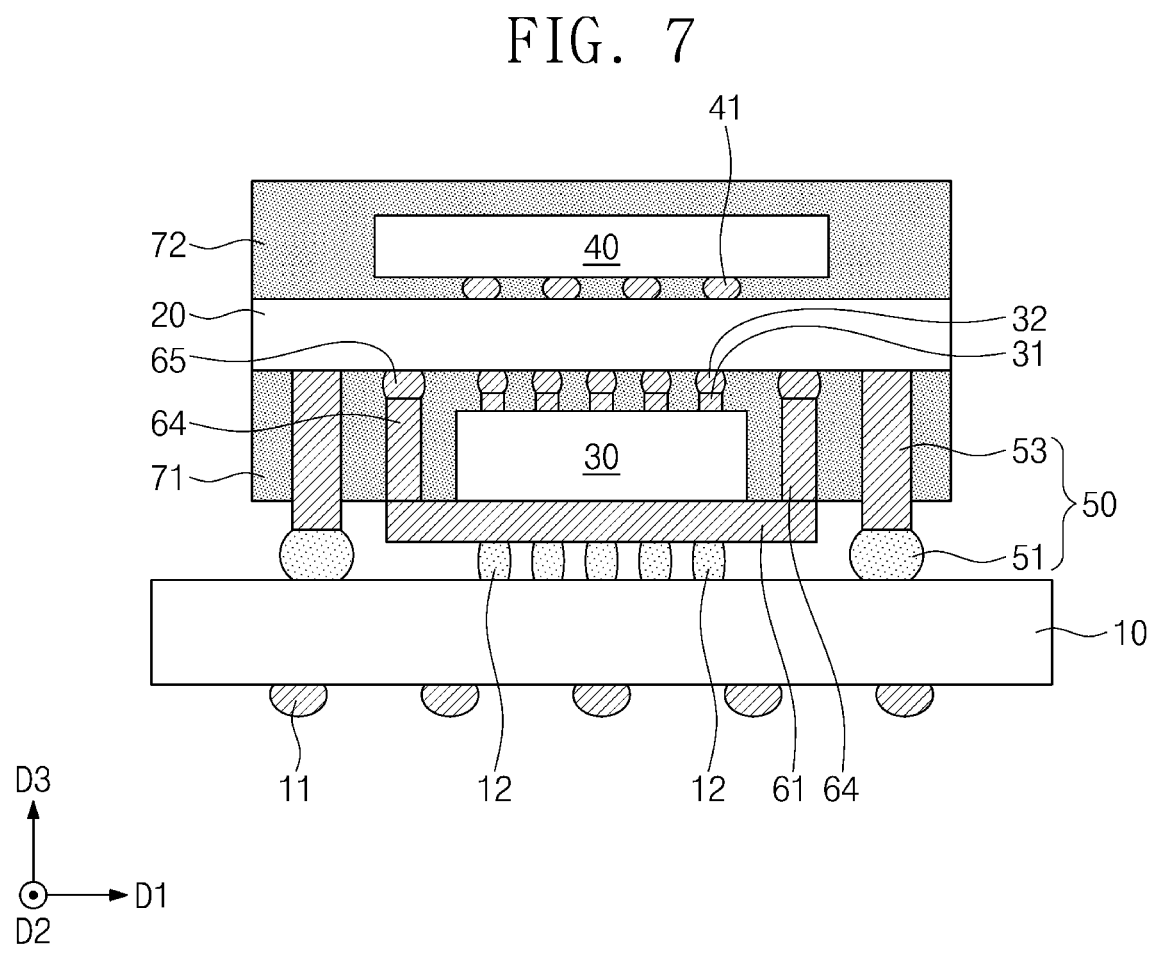

FIG. 7 illustrates a cross-sectional view showing a semiconductor package according to some embodiments. Except that discussed below, a semiconductor package of FIG. 7 may be similar to the semiconductor package of FIG. 1 and a repeated description of similar or identical elements may be omitted for economy of description.

Referring to FIG. 7, each of the connection conductive structures 50, which electrically connect the first substrate 10 and the second substrate 20 to each other, may include a connection conductive member 51 and a connection pillar 53 on the connection conductive member 51.

The connection pillar 53 may be connected to the connection conductive member 51 and the second substrate 20. In an embodiment, a top surface of the connection pillar 53 may be in direct contact with a bottom surface of the second substrate 20 and a bottom surface of the connection pillar 53 may be in direct contact with a top surface of the connection conductive member 51. When viewed in cross-section as shown in FIG. 7, the connection pillar 53 may have a flat sidewall. The connection pillar 53 may have a cylindrical shape. The connection pillar 53 may have a constant width (e.g., a uniform width) in the first direction D1. The connection pillar 53 may include a conductive material. For example, in an embodiment the connection pillar 53 may include Cu. However, embodiments of the present concept are not necessarily limited thereto.

Plate connection pillars 64 and plate connection bumps 65 may be provided to electrically connect the plate 61 and the second substrate 20 to each other. The plate connection pillar 64 may be disposed on (e.g., disposed directly thereon in the third direction D3) the plate 61. A bottom surface of the plate connection pillar 64 may be in direct contact with a top surface of the plate 61. The plate connection pillars 64 may be spaced apart from each other in the first direction D1. The first semiconductor chip 30, the chip connection pillars 31, and the first chip connection bumps 32 may be disposed between adjacent plate connection pillars 64 (e.g., in the first direction D1). When viewed in cross-section as shown in FIG. 7, the plate connection pillar 64 may have a flat sidewall. The plate connection pillar 64 may have a cylindrical shape. In an embodiment, the plate connection pillar 64 may have a constant width in the first direction D1. The plate connection pillar 64 may include a conductive material. For example, in an embodiment the plate connection pillar 64 may include Cu. However, embodiments of the present inventive concept are not necessarily limited thereto.

The plate connection bump 65 may be disposed on (e.g., disposed directly thereon in the third direction D3) the plate connection pillar 64. A bottom surface of the plate connection bump 65 may be in direct contact with a top surface of the plate connection pillar 64. A top surface of the plate connection bump 65 may be in direct contact with the bottom surface of the second substrate 20. When viewed in cross-section as shown in FIG. 7, the plate connection bump 65 may have a curved sidewall. In an embodiment, a width in the first direction D1 of the plate connection bump 65 may be changed in accordance with the vertical level. A width in the first direction D1 at an intermediate portion (e.g., in the vertical direction, such as the third direction D3) of the plate connection bump 65 may be greater than widths in the first direction D1 at uppermost and lowermost portions (e.g., in the vertical direction, such as the third direction D3) of the plate connection bump 65. In an embodiment, the plate connection bump 65 may include a different conductive material from that of the plate connection pillar 64. For example, the plate connection bump 65 may include at least one compound selected from Sn, Cu, Au, and Ag.

Figure 8:
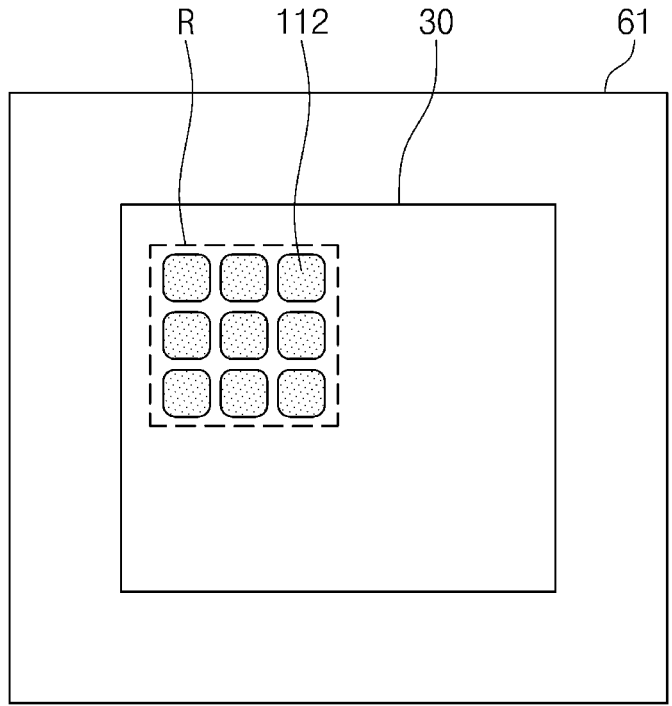
FIG. 8 illustrates a plan view showing an arrangement of heat transfer structures in a semiconductor package according to an embodiment of the present inventive concept.
Figure 8:
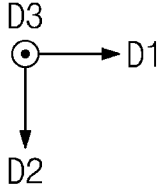

FIG. 8 illustrates a plan view showing an arrangement of heat transfer structures in a semiconductor package according to some embodiments. Except that discussed below, a semiconductor package of FIG. 8 may be similar to the semiconductor package of FIG. 1 and a repeated description of similar or identical elements may be omitted for economy of description.

Referring to FIG. 8, the first semiconductor chip 30 may include a heating region R. The heating region R may be an area having a relatively high temperature when the first semiconductor chip 30 operates.

The heat transfer structures 112 connected to the plate 61 may overlap in the third direction D3 with the heating region R of the first semiconductor chip 30. As the heat transfer structures 112 overlap the heating region R, a semiconductor package may have increased heat dissipation properties. In an embodiment, each of the heat transfer structures 212 may have a square shape with rounded corners when viewed in plan as shown in FIG. 8.

Figure 9:
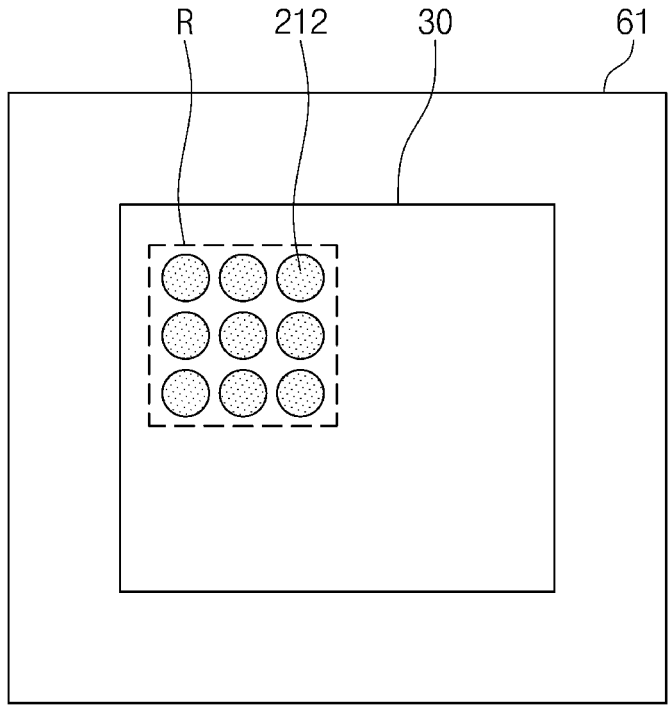
FIG. 9 illustrates a plan view showing an arrangement of heat transfer structures in a semiconductor package according to an embodiment of the present inventive concept.
Figure 9:
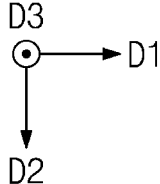

FIG. 9 illustrates a plan view showing an arrangement of heat transfer structures in a semiconductor package according to some embodiments. Except that discussed below, a semiconductor package of FIG. 9 may be similar to the semiconductor package of FIG. 1 and a repeated description of similar or identical elements may be omitted for economy of description.

Referring to FIG. 9, heat transfer structures 212 may be disposed to overlap in the third direction D3 with the heating region R of the first semiconductor chip 30. In an embodiment, each of the heat transfer structures 212 may have a circular shape when viewed in plan as shown in FIG. 9.

Figure 10:
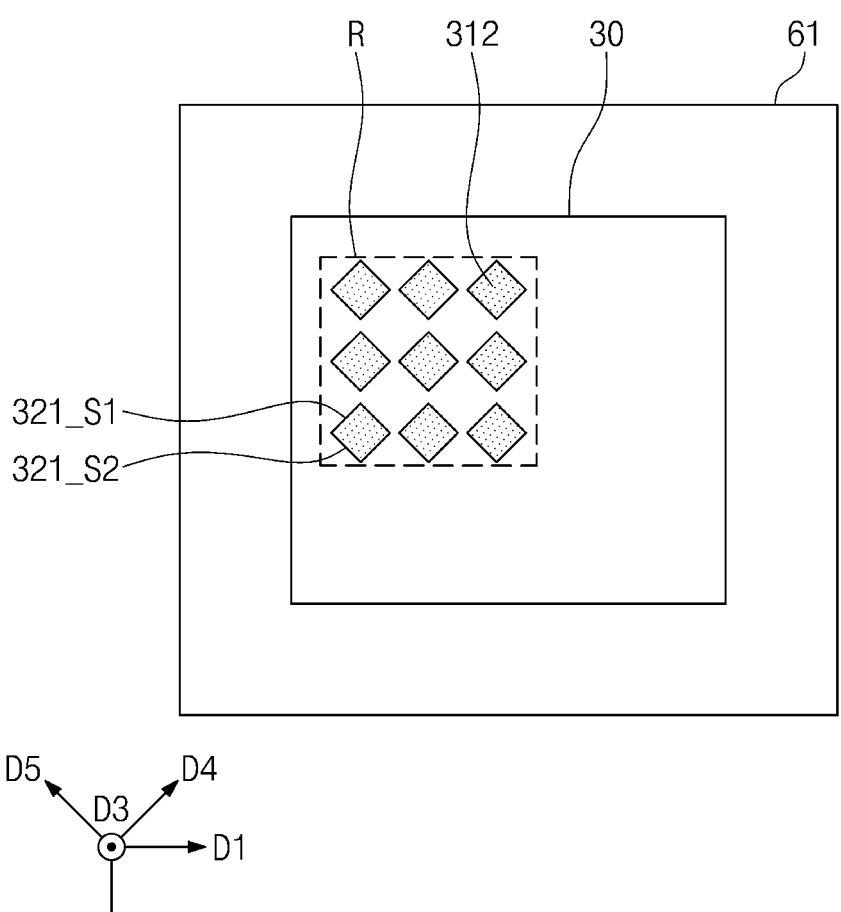
FIG. 10 illustrates a plan view showing an arrangement of heat transfer structures in a semiconductor package according to an embodiment of the present inventive concept.

FIG. 10 illustrates a plan view showing an arrangement of heat transfer structures in a semiconductor package according to some embodiments. Except that discussed below, a semiconductor package of FIG. 10 may be similar to the semiconductor package of FIG. 1 and a repeated description of similar or identical elements may be omitted for economy of description.

Referring to FIG. 10, heat transfer structures 312 may be disposed to overlap in the third direction D3 with the heating region R of the first semiconductor chip 30. In an embodiment, each of the heat transfer structures 312 may have a rhombic shape when viewed in plan as shown in FIG. 10.

Extending directions of sidewalls of the heat transfer structure 312 may intersect extending directions of sidewalls of the plate 61 and extending directions of sidewalls of the first semiconductor chip 30. For example, in an embodiment the heat transfer structure 312 may include first sidewalls 312_S1 that extend in a fourth direction D4 and second sidewalls 312_S2 that extend in a fifth direction D5. The sidewalls of the plate 61 and the sidewalls of the first semiconductor chip 30 may extend in the first direction D1 or the second direction D2. The fourth direction D4 and the fifth direction D5 may be horizontal directions that intersect the first direction D1 and the second direction D2.

Figure 11:
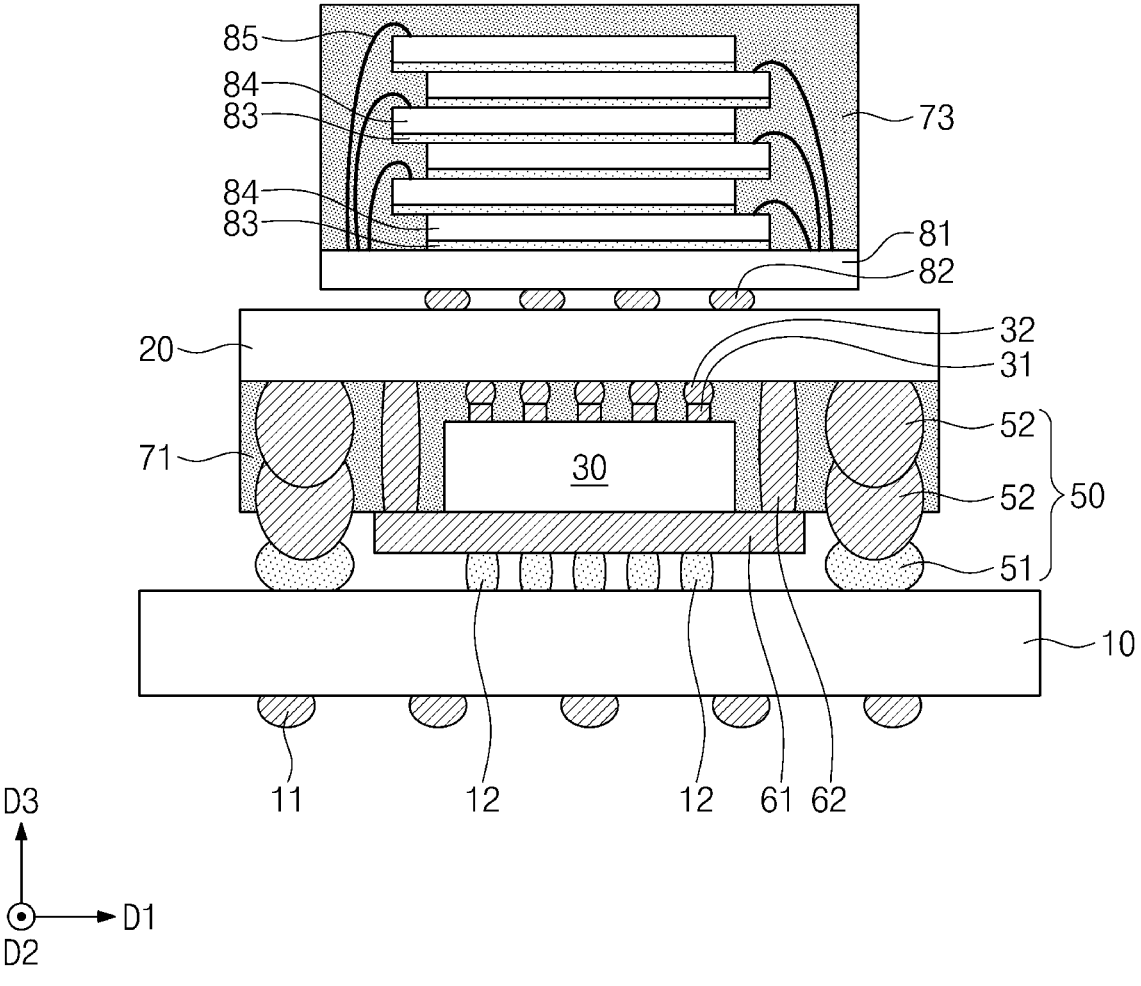
FIG. 11 illustrates a cross-sectional view showing a semiconductor package according to an embodiment of the present inventive concept.

FIG. 11 illustrates a cross-sectional view showing a semiconductor package according to some embodiments. Except that discussed below, a semiconductor package of FIG. 11 may be similar to the semiconductor package of FIG. 1 and a repeated description of similar or identical elements may be omitted for economy of description.

Referring to FIG. 11, package connection bumps 82 may be disposed on (e.g., disposed directly thereon in the third direction D3) the second substrate 20. The package connection bump 82 may include a conductive material. For example, in an embodiment the package connection bump 82 may include at least one compound selected from Sn, Cu, Au, and Ag.

A third substrate 81 may be disposed on (e.g., disposed directly thereon in the third direction D3) the package connection bumps 82. The third substrate 81 may be electrically connected through the package connection bumps 82 to the second substrate 20. The third substrate 81 may include conductive structures to electrically connect to each other components mounted on the third substrate 81. For example, in an embodiment the third substrate 81 may include a printed circuit board (PCB), a redistribution substrate, or a semiconductor substrate.

Adhesion layers 83 and stack semiconductor chips 84 may be disposed on the third substrate 81. The adhesion layers 83 and the stack semiconductor chips 84 may be alternately stacked along the third direction D3. The adhesion layer 83 may include an adhesive polymer material. The stack semiconductor chip 84 may include a semiconductor device.

In an embodiment, the semiconductor package may include wires 85 that electrically connect the stack semiconductor chip 84 to the third substrate 81. The wires 85 may include a conductive material. For example, in an embodiment the wires 85 may include Au.

In some embodiments, the stack semiconductor chips 84 may include through silicon vias, and may be hybrid-bonded to each other. In this embodiment, the stack semiconductor chips 84 may be stacked without the adhesion layers 83, and the stack semiconductor chips 84 and the third substrate 81 may be electrically connected without the wires 85.

In some embodiments, the stack semiconductor chips 84 may include through silicon vias, and may be connected through bumps. In this embodiment, the stack semiconductor chips 84 may be stacked without the adhesion layers 83, and the stack semiconductor chips 84 and the third substrate 81 may be electrically connected without the wires 85.

A third molding layer 73 may be disposed on (e.g., disposed directly thereon in the third direction D3) the third substrate 81. The third molding layer 73 may surround the stack semiconductor chips 84. The third molding layer 73 may include a dielectric material. For example, the third molding layer 73 may include an epoxy resin.

As a semiconductor package according to some embodiments of the present inventive concept may include a plate, the semiconductor package may have increased heat dissipation properties and may shield electromagnetic waves.

Although the present inventive concept has been described in connection with the some non-limiting embodiments illustrated in the accompanying drawings, it will be understood by one of ordinary skill in the art that variations in form and detail may be made therein without departing from the scope of the present inventive concept. The above described embodiments should thus be considered illustrative and not restrictive.

What is claimed is:

1. A semiconductor package, comprising:
a first substrate;
a second substrate spaced apart from the first substrate;
a semiconductor chip between the first substrate and the second substrate, the semiconductor chip is electrically connected to the second substrate;
a molding layer surrounding the semiconductor chip;
a plate directly contacting a bottom surface of the semiconductor chip; and
a heat transfer structure connecting the plate and the first substrate to each other.

2. The semiconductor package of claim 1, wherein a width of the heat transfer structure is less than a width of the plate.

3. The semiconductor package of claim 1, further comprising a connection conductive structure between the first substrate and the second substrate, the connection conductive structure electrically connecting the first substrate and the second substrate to each other.

4. The semiconductor package of claim 3, wherein the connection conductive structure includes:
a connection conductive member on the first substrate; and
at least one connection bump on the connection conductive member,
wherein a width of the connection conductive member and a width of the at least one connection bump varies in accordance with a vertical level.

5. The semiconductor package of claim 3, wherein the connection conductive structure includes:
a connection conductive member on the first substrate; and
a connection pillar on the connection conductive member,
wherein a width of the connection conductive member varies in accordance with a vertical level, and
wherein a width of the connection pillar is constant.

6. The semiconductor package of claim 1, wherein a top surface of the plate directly contacts a bottom surface of the molding layer.

7. The semiconductor package of claim 1, wherein the heat transfer structure includes a plurality of heat transfer structures that are spaced apart from each other.

8. The semiconductor package of claim 1, wherein:
the semiconductor chip includes a heating region; and
the heat transfer structure overlaps the heating region.

9. The semiconductor package of claim 1, wherein a width of the heat transfer structure is greater than a width of the semiconductor chip and less than a width of the plate.

10. A semiconductor package, comprising:
a first substrate;
a second substrate spaced apart from the first substrate;
a semiconductor chip between the first substrate and the second substrate, the semiconductor chip is electrically connected to the second substrate;
a molding layer surrounding the semiconductor chip;
a plate directly contacting a bottom surface of the semiconductor chip; and
a connection conductive structure between the first substrate and the second substrate, the connection conductive structure electrically connecting the first substrate and the second substrate to each other,
wherein a bottom surface of the molding layer includes:
a first portion directly contacting a top surface of the plate; and
a second portion spaced apart from the plate and exposed by an empty space, the empty space is positioned between the molding layer and the first substrate.

11. The semiconductor package of claim 10, further comprising a through via penetrating the molding layer and directly contacting the top surface of the plate and a bottom surface of the second substrate.

12. The semiconductor package of claim 11, wherein:
the through via includes a plurality of through vias that are spaced apart from each other; and
the semiconductor chip is positioned between the through vias.

13. The semiconductor package of claim 10, further comprising:
a plate connection pillar on the top surface of the plate; and
a plate connection bump on the plate connection pillar,
wherein the plate connection bump directly contacts the second substrate.

14. The semiconductor package of claim 10, further comprising a plurality of heat transfer structures connecting the plate and the first substrate to each other.

15. The semiconductor package of claim 14, wherein the plurality of heat transfer structures are spaced apart from each other.

16. The semiconductor package of claim 14, wherein the plurality of heat transfer structures overlaps the semiconductor chip.

17. The semiconductor package of claim 14, wherein the plate is electrically connected to a ground voltage through the plurality of heat transfer structures and the first substrate.

18. The semiconductor package of claim 10, wherein a thickness of the plate is in a range of about 1 μm to about 1,000 μm.

19. A semiconductor package, comprising:
a first substrate;
a second substrate spaced apart from the first substrate;
a first semiconductor chip between the first substrate and the second substrate;
a first molding layer surrounding the first semiconductor chip;
a plate directly contacting a bottom surface of the first semiconductor chip and a bottom surface of the first molding layer;
a through via penetrating the first molding layer and connecting the second substrate to the plate;
a connection conductive structure electrically connecting the first substrate to the second substrate;
a heat transfer structure directly contacting a bottom surface of the plate and a top surface of the first substrate;

a second semiconductor chip electrically connected to the
second substrate; and a second molding layer surrounding the second semicon-
ductor chip.

20. The semiconductor package of claim 19, wherein the
bottom surface of the plate includes:

a first portion directly contacting the heat transfer struc-
ture; and a second portion that is spaced apart from the heat transfer
structure, wherein the first portion included in the bottom surface of
the plate has an area greater than an area of the second
portion included in the bottom surface of the plate.

\* \* \* \* \*